/ United States Patent (12) United States Patent
Hachigo et al.

(10) Patent No.: US 9,312,165 B2
(45) Date of Patent: Apr. 12, 2016

(54) GROUP III NITRIDE COMPOSITE SUBSTRATE AND METHOD FOR MANUFACTURING THE SAME, AND METHOD FOR MANUFACTURING GROUP III NITRIDE SEMICONDUCTOR DEVICE

(71) Applicant: SUMITOMO ELECTRIC INDUSTRIES, LTD., Osaka-shi, Osaka (JP)

(72) Inventors: Akihiro Hachigo, Itami (JP); Keiji Ishibashi, Itami (JP); Naoki Matsumoto, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/097,460

(22) Filed: Dec. 5, 2013

(65) Prior Publication Data

US 2014/0225229 A1    Aug. 14, 2014

Related U.S. Application Data

(60) Provisional application No. 61/762,407, filed on Feb. 8, 2013.

(30) Foreign Application Priority Data

Feb. 18, 2013   (JP) ................................. 2013-029115

(51) Int. Cl.
*H01L 29/20* (2006.01)
*H01L 21/762* (2006.01)
(Continued)

(52) U.S. Cl.
CPC .... *H01L 21/76251* (2013.01); *H01L 21/76256* (2013.01); *H01L 33/007* (2013.01); *H01L 33/0079* (2013.01); *H01L 33/025* (2013.01)

(58) Field of Classification Search
CPC .................. H01L 21/02032; H01L 21/02389; H01L 21/0243; H01L 21/02458; H01L 21/0254; H01L 21/2007; H01L 21/22; H01L 21/76254; H01L 21/76898; H01L 2251/558; H01L 29/2003; H01L 29/32; H01L 2924/049; H01L 33/007; H01L 33/32
USPC .................. 257/615, 459, 676, 739, E21.088, 257/E21.567, E21.568
See application file for complete search history.

(56) References Cited

U.S. PATENT DOCUMENTS

2008/0169483 A1   7/2008 Kasai et al.
2009/0127662 A1   5/2009 Okahisa et al.
(Continued)

FOREIGN PATENT DOCUMENTS

JP   2002-319545 A   10/2002
JP   2006-210660 A   8/2006
(Continued)

OTHER PUBLICATIONS

U.S. Appl. No. 14/030,009, Sumitomo Electric Industries, Ltd.
(Continued)

*Primary Examiner* — Kyoung Lee
*Assistant Examiner* — Joannie A Garcia
(74) *Attorney, Agent, or Firm* — Drinker Biddle & Reath LLP (57) ABSTRACT

A group III nitride composite substrate includes a group III nitride film and a support substrate formed from a material different in chemical composition from the group III nitride film. The group III nitride film has a thickness of 10 μm or more. A sheet resistance of a-group III-nitride-film-side main surface of the group III nitride composite substrate is 200 Ω/sq or less. A method for manufacturing a group III nitride composite substrate includes the steps of bonding the group III nitride film and the support substrate to each other; and reducing the thickness of at least one of the group III nitride film and the support substrate bonded to each other. Accordingly, a group III nitride composite substrate of a low sheet resistance that is obtained with a high yield as well as a method for manufacturing the same are provided.

7 Claims, 3 Drawing Sheets

(51) Int. Cl.
*H01L 33/00* (2010.01)
*H01L 33/02* (2010.01)

(56) References Cited

U.S. PATENT DOCUMENTS

| | | | |
|---|---|---|---|
| 2009/0278233 A1* | 11/2009 | Pinnington | H01L 21/02389 257/615 |
| 2010/0025228 A1* | 2/2010 | Tauzin et al. | 204/192.11 |
| 2010/0164070 A1 | 7/2010 | Okahisa et al. | |
| 2010/0210089 A1 | 8/2010 | Kasai et al. | |
| 2010/0244196 A1 | 9/2010 | Yoshida | |
| 2010/0295055 A1 | 11/2010 | Yamamoto | |
| 2011/0127581 A1* | 6/2011 | Bethoux et al. | 257/201 |
| 2012/0256297 A1 | 10/2012 | Morioka et al. | |
| 2012/0305066 A1* | 12/2012 | Fisher et al. | 136/256 |
| 2013/0020580 A1* | 1/2013 | Evans et al. | 257/76 |
| 2013/0137220 A1 | 5/2013 | Matsubara et al. | |
| 2013/0161636 A1 | 6/2013 | Werkhoven et al. | |
| 2014/0103353 A1 | 4/2014 | Iishibashi et al. | |

FOREIGN PATENT DOCUMENTS

| | | |
|---|---|---|
| JP | 2008-010766 A | 1/2008 |
| JP | 2008-166646 A | 7/2008 |
| JP | 2008-303138 A | 12/2008 |
| JP | 2009-126722 A | 6/2009 |
| JP | 2009-182341 A | 8/2009 |
| JP | 2010-182936 A | 8/2010 |
| JP | 2010-269970 A | 12/2010 |
| JP | 2012-230969 A | 12/2010 |
| WO | WO 2011/093481 | 8/2011 |
| WO | WO-2014-125688 A1 | 8/2014 |

OTHER PUBLICATIONS

International Search Report and Written Opinion issued Dec. 22, 2014 in PCT Application No. PCT/JP2014/075991 (8 pages) and English Translation (8 pages).

* cited by examiner

GROUP III NITRIDE COMPOSITE SUBSTRATE AND METHOD FOR MANUFACTURING THE SAME, AND METHOD FOR MANUFACTURING GROUP III NITRIDE SEMICONDUCTOR DEVICE

This application claims the benefit of U.S. Provisional Application No. 61/762,407 filed Feb. 8, 2013, which is incorporated by reference herein in the entirety.

BACKGROUND OF THE INVENTION

1. Field of the Invention

The present invention relates to a group III nitride composite substrate and a method for manufacturing the same, as well as a method for manufacturing a group III nitride semiconductor device using the group III nitride composite substrate.

2. Description of the Background Art

Group III nitride semiconductors such as GaN, AlN, $Al_xGa_{1-x}N$ (0<x<1), and the like have superior semiconductor properties and are therefore suitable for a substrate of a semiconductor device. Such group III nitride semiconductors are expensive. Therefore, in order to reduce the cost of manufacturing a semiconductor device, there has been proposed a substrate of a semiconductor device, specifically a semiconductor substrate in which a film of a group III nitride semiconductor such as GaN, AlN, or the like is formed on a support substrate such as silicon substrate.

For example, Japanese Patent Laying-Open No. 2006-210660 discloses a method for manufacturing a semiconductor substrate including the steps of: implanting ions into a front surface and its vicinity of a first nitride semiconductor substrate made from GaN, AlN, or the like; superposing a second substrate on the front surface of the first nitride semiconductor substrate; heat-treating the two substrates superposed on each other; and stripping most of the first nitride semiconductor substrate from the second substrate along a layer in which the ions are implanted.

SUMMARY OF THE INVENTION

In a semiconductor substrate produced by the method for manufacturing a semiconductor substrate disclosed in Japanese Patent Laying-Open No. 2006-210660, the thickness of the nitride semiconductor formed on the support substrate is a thin thickness on the order of 2 μm, and thus the semiconductor substrate suffers from a problem of a high sheet resistance of the substrate, and a problem of a low yield because the substrate is partially of an increased resistance due to damage caused by the ion implantation.

The present invention aims to solve the above problems and provide a group III nitride composite substrate having a low sheet resistance and produced with a high yield, and a method for manufacturing the same, as well as a method for manufacturing a group III nitride semiconductor device using the group III nitride composite substrate.

According to an aspect of the present invention, a group III nitride composite substrate includes a group III nitride film and a support substrate formed from a material different in chemical composition from the group III nitride film. Here, the group III nitride film is joined to the support substrate in one of a direct manner and an indirect manner. The group III nitride film has a thickness of 10 μM or more. A sheet resistance of a group III-nitride-film-side main surface of the group III nitride composite substrate is 200 Ω/sq or less. Here, the group III-nitride-film-side main surface is the main surface which is common to the group III nitride composite substrate and the group III nitride film. In this group III nitride composite substrate, the thickness of the group III nitride film is 10 μm or more, and therefore, the sheet resistance of the group III-nitride-film-side main surface of the group III nitride composite substrate can be reduced to 200 Ω/sq or less, and group III nitride semiconductor devices can thus be manufactured with a high yield.

In the group III nitride composite substrate according to the above aspect of the present invention, an area of a joined region joining the group III nitride film and the support substrate is 70% or more relative to an area of the main surface, a non-joined region failing to join the group III nitride film and the support substrate includes at least one non-joined partial region, and the non-joined partial region may be a small non-joined partial region having a maximum size in radial direction of less than 20 mm. In this group III nitride composite substrate, the area of the joined region is a large area of 70% or more relative to the area of the main surface and the maximum size in radial direction of the non-joined partial region forming the non-joined region is a small size of less than 20 mm. Therefore, group III nitride semiconductor devices can be manufactured with a high yield.

In the group III nitride composite substrate according to the above aspect of the present invention, a non-joined region failing to join the group III nitride film and the support substrate includes at least one non-joined partial region, and the non-joined partial region may be an inner non-joined partial region failing to abut on a perimeter of the main surface. In this group III nitride composite substrate, the non-joined partial region forming the non-joined region does not abut on the perimeter of the main surface. Therefore, group III nitride semiconductor devices can be manufactured with a high yield.

In the group III nitride composite substrate according to the above aspect of the present invention, the group III nitride film has a main-surface through hole, and an area of the main-surface through hole may be 10% or less relative to an area of the main surface. In this group III nitride composite substrate, the area of the main-surface through hole is 10% or less relative to the area of the main surface. Therefore, group III nitride semiconductor devices can be manufactured with a high yield.

In the group III nitride composite substrate according to the above aspect of the present invention, a joint interface between the group III nitride film and the support substrate includes an impurity containing metal, and the concentration of the impurity may be $1\times10^{10}$ cm$^{-2}$ or more. In this group III nitride composite substrate, the concentration of the impurity containing metal in the joint interface is $1\times10^{10}$ cm$^{-2}$ or more. Therefore, group III nitride semiconductor devices with a high joint strength can be manufactured with a high yield.

In the group III nitride composite substrate according to the above aspect of the present invention, the group III nitride film may have a thermal expansion coefficient of more than 0.7 times and less than 1.4 times as large as a thermal expansion coefficient of the support substrate. In this group III nitride composite substrate, the thermal expansion coefficient of the group III nitride film is more than 0.7 times and less than 1.4 times as large as the thermal expansion coefficient of the support substrate. Therefore, in the step of applying heat during manufacture of a group III nitride semiconductor device, occurrence of warp and/or cracks is prevented, and accordingly group III nitride semiconductor devices can be manufactured with a high yield.

In the group III nitride composite substrate according to the above aspect of the present invention, the support substrate may have a fracture toughness of 1 MNm$^{-2/3}$ or more, and the support substrate may have a thickness of 50 μm or more. In this group III nitride composite substrate, the mechanical strength is high. Therefore, group III nitride semiconductor devices can be manufactured with a high yield.

In the group III nitride composite substrate according to the above aspect of the present invention, the indirect manner may be a manner of interposing a joint film between the group III nitride film and the support substrate. In this group III nitride composite substrate, the group III nitride film and the support substrate are joined to each other with the joint film interposed therebetween. Therefore, group III nitride semiconductor devices having a high joint strength can be manufactured with a high yield.

A method for manufacturing a group III nitride composite substrate according to another aspect of the present invention is a method for manufacturing a group III nitride composite substrate of the above aspect, and includes the steps of: bonding the group III nitride film and the support substrate to each other in one of a direct manner and an indirect manner; and reducing the thickness of at least one of the group III nitride film and the support substrate bonded to each other. This method for manufacturing a group III nitride composite substrate includes these steps so that group III nitride composite substrates with a low sheet resistance can be manufactured with a high yield.

A method for manufacturing a group III nitride semiconductor device according to still another aspect of the present invention is a method for manufacturing a group III nitride semiconductor device using a group III nitride composite substrate of the above aspect, and includes the steps of: preparing the group III nitride composite substrate; and growing at least one group III nitride layer on the main surface of the side of the group III nitride film of the group III nitride composite substrate. This method for manufacturing a group III nitride semiconductor device includes these steps so that group III nitride semiconductor devices can be manufactured with a high yield.

In accordance with the present invention, a group III nitride composite substrate having a low sheet resistance and produced with a high yield, and a method for manufacturing the same, as well as a method for manufacturing a group III nitride semiconductor device using the group III nitride composite substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Group III Nitride Composite Substrate

Figure 1:
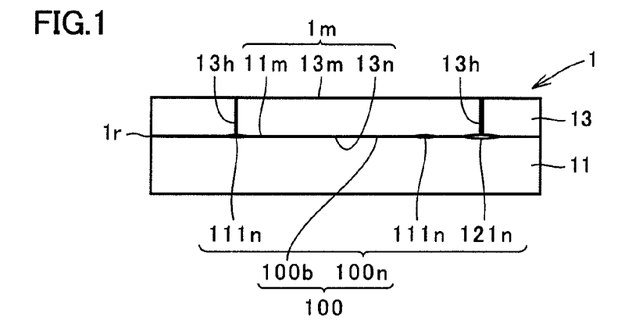
FIG. 1 is a schematic cross-sectional view showing an example of the group III nitride composite substrate according to the present invention.
Figure 2:
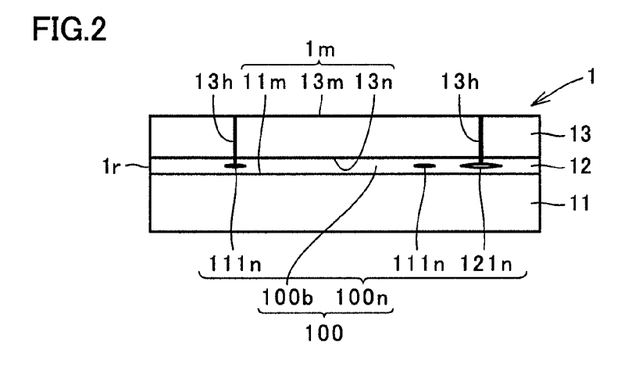
FIG. 2 is a schematic cross-sectional view showing another example of the group III nitride composite substrate according to the present invention.

Referring to FIGS. 1 and 2, a group III nitride composite substrate 1 which is an embodiment of the present invention includes a group III nitride film 13 and a support substrate 11 formed from a material which is different in chemical composition from group III nitride film 13. Here, group III nitride film 13 is joined to support substrate 11 in one of a direct manner and an indirect manner. Group III nitride film 13 has a thickness of 10 μm or more. A sheet resistance of a group III-nitride-film 13-side main surface 13m of group III nitride composite substrate 1 is 200 Ω/sq or less. Here, group III-nitride-film-side main surface 13m is the main surface which is common to group III nitride composite substrate 1 and group III nitride film 13.

In group III nitride composite substrate 1 of the present embodiment, group III nitride film 13 has a thickness of 10 μm or more, and therefore, the sheet resistance of group III-nitride-film 13-side main surface 13m can be reduced to 200 Ω/sq or less. Thus, group III nitride semiconductor devices can be manufactured with a high yield. Details will be described in the following.

Group III nitride composite substrate 1 of the present embodiment includes group III nitride film 13, and support substrate 11 formed from a material different in chemical composition from group III nitride film 13.

<Group III Nitride Film>

Group III nitride film 13 is a substrate formed from a semiconductor which is a compound of at least one group III element and nitrogen, and the substrate may for example be GaN substrate, AlN substrate, $Al_xGa_{1-x}N$ substrate (0<x<1), or the like. The method for manufacturing this group III nitride film 13 is not particularly limited. This method may be a gas phase method such as HVPE (Hydride Vapor Phase Epitaxy), sublimation method, or the like, may be a liquid phase method such as high nitrogen pressure solution method, flux method, or the like. In order to grow a group III nitride layer of high crystal quality on group III nitride film 13, group III nitride film 13 is preferably crystal, and more preferably single crystal.

In order to reduce the sheet resistance of group III nitride film 13, group III nitride film 13 may be doped with a conductivity improver impurity. This conductivity improver impurity is not particularly limited. O (oxygen) atom, Si (silicon) atom, and the like are suitable since they are highly effective in improving the conductivity.

<Support Substrate>

Support substrate 11 is a substrate supporting group III nitride film 13, and is not particularly limited as long as it is a substrate formed from a material which is different in chemical composition from group III nitride film 13. The support substrate may be an oxide substrate, and examples of the oxide substrate are: sapphire substrate and other $Al_2O_3$ substrates; mullite substrate and other $Al_2O_3$—$SiO_2$-based substrates; spinel substrate and other $Al_2O_3$—MgO-based substrates; $Al_2O_3$—$SiO_2$—YSZ (Yttria Stabilized Zirconia)-based substrate, and the like. The support substrate may also be a metal substrate such as Mo substrate, W substrate, Cu—W substrate, or the like. It may also be Si substrate, SiC substrate, graphite substrate, or the like. In addition, in the case where group III nitride film 13 is a GaN film, the support substrate may be a substrate formed from AlN for example which is a group III nitride different in chemical composition from GaN. Support substrate 11 may be either crystal or amorphous. In the case where support substrate 11 is crystal, it may be either single crystal or polycrystal.

<Manner of Joining Group III Nitride Film and Support Substrate>

In group III nitride composite substrate 1 of the present embodiment, group III nitride film 13 is joined to support substrate 11 in one of a direct manner and an indirect manner.

Referring to FIG. 1, the joint in a direct manner means that group III nitride film 13 and support substrate 11 are directly joined to each other without a separate element interposed therebetween. In the case of this direct joint manner, a joint interface 100 is an interface formed by a main surface 13n of group III nitride film 13 and a main surface 11m of support substrate 11 that are joined to each other.

Referring to FIG. 2, the joint in an indirect manner means that group III nitride film 13 and support substrate 11 are indirectly joined to each other with a separate element such as a joint film 12 for example interposed therebetween. In the case of this indirect joint manner, the joint interface varies depending on how the substrate and the film are bonded to each other as described below.

Figure 4:
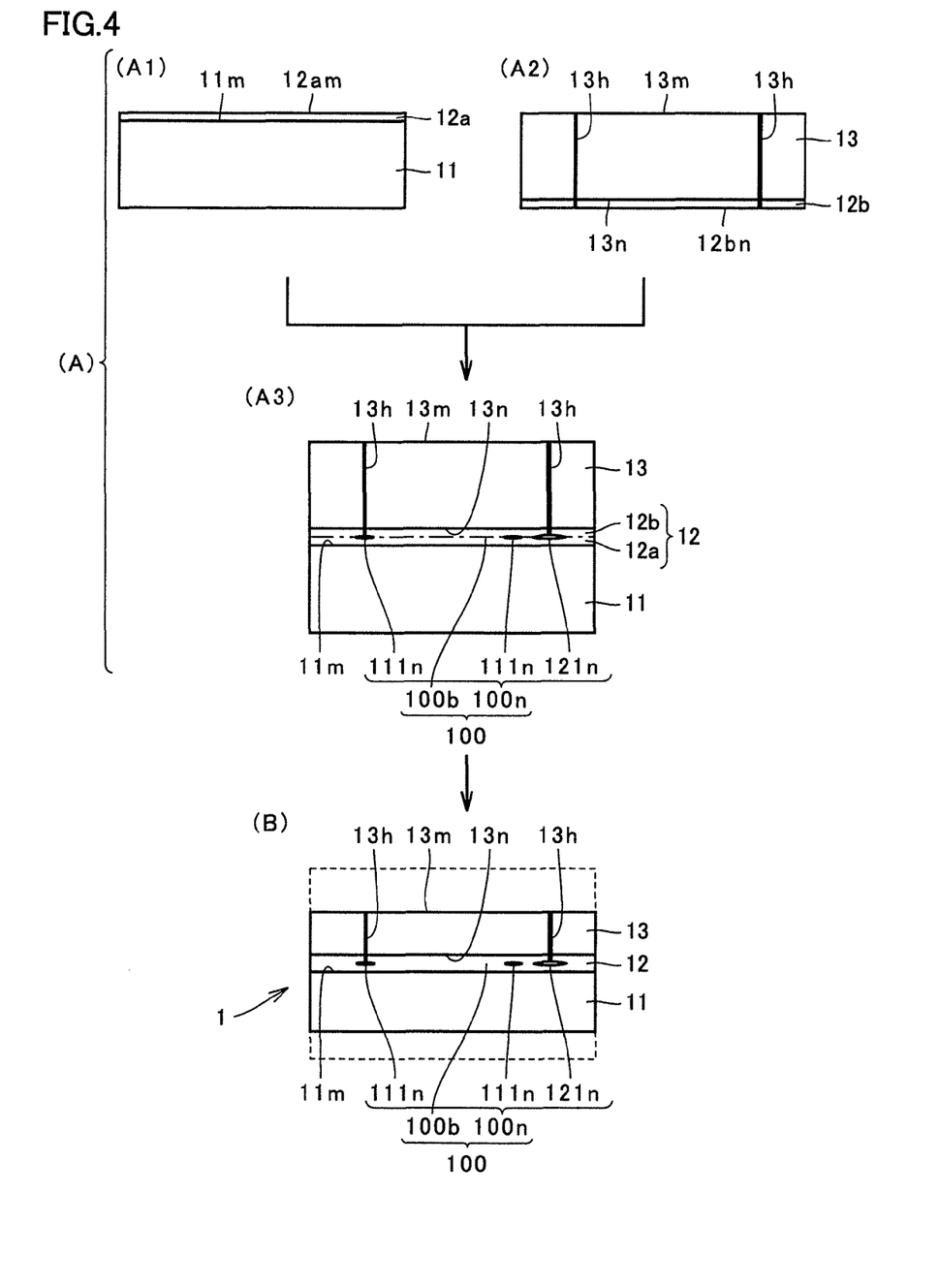
FIG. 4 is a schematic cross-sectional view showing an example of the method for manufacturing a group III nitride composite substrate according to the present invention.

A first bonding method is as follows. As shown in FIGS. 2 and 4, a joint film 12a is formed on main surface 11m of support substrate 11 and a joint film 12b is formed on main surface 13n of group III nitride film 13. After this, a main surface 12am of joint film 12a and a main surface 12bn of joint film 12b are bonded to each other to thereby form joint film 12 into which joint film 12a and joint film 12b are integrated. In this case, joint interface 100 is a surface formed by main surface 12am of joint film 12a and main surface 12bn of joint film 12b that are joined to each other in joint film 12.

A second bonding method is as follows. Joint film 12 is formed on main surface 11m of support substrate 11 and thereafter the main surface of joint film 12 and main surface 13n of group III nitride film 13 are bonded to each other. In this case, joint interface 100 is a surface formed by the main surface of joint film 12 and main surface 13n of group III nitride film 13 that are joined to each other.

A third bonding method is as follows. Joint film 12 is formed on main surface 13n of group III nitride film 13, and thereafter the main surface of joint film 12 and main surface 11m of support substrate 11 are bonded to each other. In this case, joint interface 100 is a surface formed by the main surface of joint film 12 and main surface 11m of support substrate 11 that are joined to each other.

<Joint Film>

Joint film 12 which may be included between group III nitride film 13 and support substrate 11 in group III nitride composite substrate 1 of the present embodiment is not particularly limited as long as the joint film serves to increase the strength with which group III nitride film 13 and support substrate 11 are joined. The joint film may be $SiO_2$ film, $Si_3N_4$ film, AlN film, $Al_2O_3$ film, $TiO_2$ film, TiN film, $Ga_2O_3$ film, W film, Mo film, Au—Sn film, or the like.

The thickness of joint film 12 is not particularly limited. For the sake of increasing the strength with which group III nitride film 13 and support substrate 11 are joined to each other, the thickness is preferably 0.05 μM or more, and more preferably 0.1 μm or more. For the sake of improving the in-plane uniformity and the flatness of joint film 12, the thickness is preferably 5 μm or less, and more preferably 2 μm or less.

<Thickness of Group III Nitride Film>

Regarding group III nitride composite substrate 1 in the present embodiment, for the sake of reducing the sheet resistance of group III-nitride-film 13-side main surface 13m of group III nitride composite substrate 1, the thickness of group III nitride film 13 needs to be 10 μm or more, and is preferably 50 μm or more, and more preferably 100 μm or more. For the sake of reducing the cost of group III nitride composite substrate 1, the thickness of group III nitride film 13 is preferably 500 μm or less, and more preferably 250 μm or less.

<Sheet Resistance of Group III-Nitride-Film-Side Main Surface>

Regarding group III nitride composite substrate 1 in the present embodiment, for the sake of improving device properties of a group III nitride semiconductor device (such as luminous efficiency of a light-emitting device, for example) that are achieved by reducing the sheet resistance of group III nitride composite substrate 1, the sheet resistance of group III-nitride-film 13-side main surface 13m of group III nitride composite substrate 1 needs to be 200 Ω/sq (ohms per square) or less, and is preferably 50 Ω/sq or less, and more preferably 10 Ω/sq or less.

<Joined Region Joining Group III Nitride Film and Support Substrate and Non-Joined Region Failing to Join Group III Nitride Film and Support Substrate>

Figure 3:
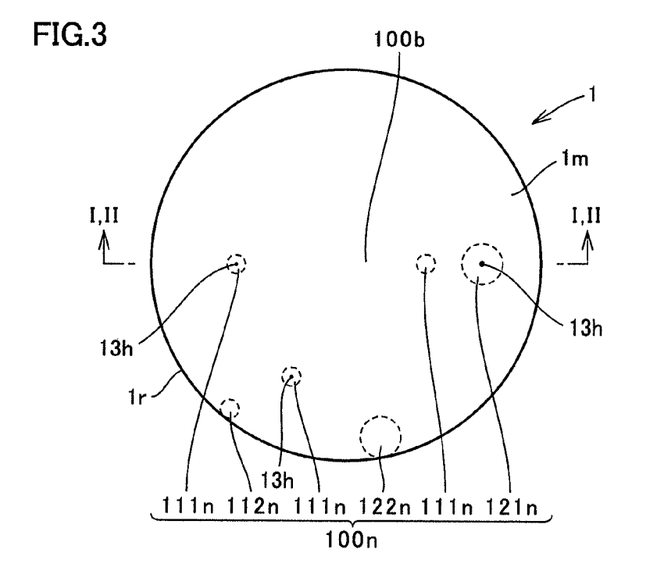
FIG. 3 is a schematic plan view showing a joined region and non-joined regions in the group III nitride composite substrate according to the present invention.

Referring to FIGS. 1 to 3, in group III nitride composite substrate 1 of the present embodiment, group III nitride film 13 is bonded to support substrate 11 along the above-described joint interface 100. Like a group III nitride composite substrate produced by the ion implantation method, group III nitride composite substrate 1 in the present embodiment also has surface roughness of respective main surfaces of support substrate 11, group III nitride film 13, and joint films 12, 12a, 12b, a main-surface through hole 13h of group III nitride film 13, non-uniformity of bonding, and the like. As a result, in group III nitride composite substrate 1 of the present embodiment, joint interface 100 includes a joined region 100b where group III nitride film 13 and support substrate 11 are joined to each other in either the direct manner or the indirect manner, and a non-joined region 100n where group III nitride film 13 and support substrate 11 are not joined to each other in either the direct manner or the indirect manner.

The presence, respective positions, respective sizes, and respective areas of joined region 100b and non-joined region 100n in joint interface 100 of group III nitride composite substrate 1 in the present embodiment can be measured by means of an ultrasonic microscope, a defect evaluation apparatus, or the like.

Non-joined region 100n in joint interface 100 of group III nitride composite substrate 1 in the present embodiment includes at least one non-joined partial region 111n, 112n, 121n, 122n. Although the shape of non-joined partial regions 111n, 112n, 121n, 122n is indefinite, the shape is substantially circular or elliptical. Therefore, the size of the non-joined region is evaluated on the basis of the maximum size in radial direction (maximum diameter). Non-joined partial regions 111n, 112n, 121n, 122n can be classified by size into small non-joined partial regions 111n, 112n having a maximum size in radial direction of less than 20 mm, and large non-joined partial regions 121n, 122n having a maximum radial size of 20 mm or more. Non-joined partial regions 111n, 112n, 121n, 122n can also be classified, by the position where the region is located, into inner non-joined partial regions 111n, 121n which do not abut on a perimeter 1r of a main surface 1m, and outer non-joined partial regions 112n, 122n which abut on perimeter 1r of main surface 1m.

Regarding group III nitride composite substrate 1 in the present embodiment, in order to manufacture group III nitride semiconductor devices with a high yield, the area of joined region 100b joining group III nitride film 13 and support substrate 11 relative to the area of main surface 1m is preferably 70% or more, and more preferably 85% or more. If the area of joined region 100b joining group III nitride film 13 and support substrate 11 relative to the area of main surface 1m is less than 70%, group III nitride film 13 and support substrate 11 are more likely to be separated from each other during a process of manufacturing a group III nitride semiconductor device, which makes it difficult to increase the yield of group III nitride semiconductor devices.

Regarding group III nitride composite substrate 1 in the present embodiment, in order to manufacture group III nitride semiconductor devices with a high yield, the non-joined partial region is preferably small non-joined partial region 111n, 112n having a maximum size in radial direction of less than 20 mm. Namely, in FIG. 3, any non-joined partial region is preferably small non-joined partial region 111n, 112n.

Moreover, regarding group III nitride composite substrate 1 in the present embodiment, in order to manufacture group III nitride semiconductor devices with a high yield, the non-joined partial region is preferably inner non-joined partial region 111n, 121n which does not abut on perimeter 1r of main surface 1m. Namely, in FIG. 3, any non-joined partial region is preferably inner non-joined partial region 111n, 121n. In the case of group III nitride composite substrate 1 including outer non-joined partial region 112n, 122n, contaminants may enter joint interface 100 during a process of fabricating group III nitride composite substrate 1 and a process of manufacturing a group III nitride semiconductor device using group III nitride composite substrate 1, and the contaminants are difficult to remove by cleaning. In this case, the yield of group III nitride semiconductor devices is difficult to increase. In addition, group III nitride composite substrate 1 including outer non-joined partial region 112n, 122n is broken through treatment during the step of reducing the thickness of at least one of the bonded group III nitride film 13 and support substrate 11. In this case as well, the yield of group III nitride semiconductor devices is difficult to increase.

Regarding group III nitride composite substrate 1 in the present embodiment, in order to manufacture group III nitride semiconductor devices with a high yield, the non-joined partial region is more preferably small and inner non-joined partial region 111n. Namely, in FIG. 3, any non joined partial region is preferably small and inner non-joined partial region 111n.

<Main-Surface Through Hole of Group III Nitride Film>

Referring to FIGS. 1 to 3, regarding group III nitride composite substrate 1 in the present embodiment, in order to manufacture group III nitride semiconductor devices with a high yield, the area of main-surface through hole 13h of group III nitride film 13 relative to the area of main surface 1m, 13m is preferably 10% or less, and more preferably 5% or less. Here, main-surface through hole 13h is a hole extending through group III nitride film 13 between its main surface which is directly or indirectly joined to support substrate 11 and the other surface (specifically another main surface and side surface).

The presence of main-surface through hole 13h of group III nitride film 13 in group III nitride composite substrate 1 causes non-joined region 100n to be formed on main-surface through hole 13h and its nearby region. When a group III nitride semiconductor device is cleaned in the process of manufacturing the group III nitride semiconductor device, a cleaning agent may enter the joint interface through main-surface through hole 13h to thereby cause reduction of the joint strength of group III nitride composite substrate 1. If the area of main-surface through hole 13h relative to the area of main surface 1m is 10% or more, the area of non-joined region 100n is accordingly larger, resulting in the difficulty in increasing the yield of group III nitride semiconductor devices.

<Impurity Containing Metal in Joint Interface>

Referring to FIGS. 1 to 3, regarding group III nitride composite substrate 1 in the present embodiment, in order to manufacture group III nitride semiconductor devices with a high yield by increasing the joint strength, the concentration of an impurity containing metal that is included in joint interface 100 between group III nitride film 13 and support substrate 11 is preferably $1 \times 10^{10}$ $cm^{-2}$ or more, and more preferably $1.5 \times 10^{10}$ $cm^{-2}$ or more. The impurity containing metal is not particularly limited. In order to increase the joint strength, the impurity is preferably an oxide of a base metal such as Fe (iron), Ni (nickel), or the like which has a higher ionization tendency and more easily oxidizes than H (hydrogen), in the case where group III nitride composite substrate 1 includes, as joint film 12, an oxide film such as $SiO_2$ film.

<Thermal Expansion Coefficient of Group III Nitride Film and Thermal Expansion Coefficient of Support Substrate>

Referring to FIGS. 1 to 3, regarding group III nitride composite substrate 1 in the present embodiment, in order to suppress occurrence of warp and/or cracks during manufacture of a group III nitride semiconductor device and thereby manufacture group III nitride semiconductor devices with a high yield, group III nitride film 13 has a thermal expansion coefficient of preferably more than 0.7 times and less than 1.4 times, and more preferably 0.75 times or more and 1.25 times or less as large as a thermal expansion coefficient of support substrate 11.

<Fracture Toughness and Thickness of Support Substrate>

Referring to FIGS. 1 to 3, regarding group III nitride composite substrate 1 in the present embodiment, in order to suppress occurrence of warp and/or cracks during manufacture of a group III nitride semiconductor device, the support substrate has a fracture toughness of preferably 1 $MNm^{-2/3}$ or more, and more preferably 1.5 $MNm^{-2/3}$ or more. In addition, the support substrate has a thickness of preferably 50 μm or more, and more preferably 100 μm or more.

Second Embodiment

Method for Manufacturing Group III Nitride Composite Substrate

Referring to FIGS. 1, 2, and 4, a method for manufacturing group III nitride composite substrate 1 which is another embodiment of the present invention is a method for manufacturing group III nitride composite substrate 1 in the first embodiment, and includes the steps of: bonding group III nitride film 13 and support substrate 11 to each other in one of a direct manner and an indirect manner (FIG. 4 (A)); and reducing the thickness of at least one of group III nitride film 13 and support substrate 11 (FIG. 4 (B)). The method for manufacturing group III nitride composite substrate 1 in the present embodiment can include the steps above to thereby manufacture group III nitride composite substrates of a low sheet resistance with a high yield.

<Step of Bonding Group III Nitride Film and Support Substrate>

Referring to FIGS. 1, 2, and 4, the method for manufacturing group III nitride composite substrate 1 in the present embodiment includes the step of firstly bonding group III nitride film 13 and support substrate 11 to each other in one of a direct manner and an indirect manner. Here, bonding group III nitride film 13 and support substrate 11 to each other in a direct manner means that group III nitride film 13 and support substrate 11 are directly bonded to each other without a separate element interposed therebetween. Bonding group III nitride film 13 and support substrate 11 to each other in an indirect manner means that group III nitride film 13 and support substrate 11 are indirectly bonded to each other with a separate element such as joint film 12 interposed therebetween.

The method for bonding group III nitride film 13 and support substrate 11 to each other is not particularly limited regardless of whether they are bonded in the direct manner or the indirect manner. Suitable methods include: a direct bonding method according to which respective surfaces to be bonded to each other are cleaned, bonded together as they are, and thereafter heated to approximately 600° C. to 1200° C. so that they are joined together; a surface activated bonding method according to which the surfaces to be bonded to each other are cleaned, subjected to an activation treatment by means of plasma or ions, and thereafter joined together in a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that they are joined together; a high vacuum bonding method according to which the surfaces to be bonded to each other are cleaned with a chemical solution and pure water, and thereafter joined together in a high vacuum atmosphere on the order of $10^{-6}$ Pa to $10^{-3}$ Pa, and the like. Any of the above-referenced bonding methods can increase the temperature to approximately 600° C. to 1200° C. after they are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after they are joined together.

While group III nitride film 13 and support substrate 11 may be bonded to each other in either the direct manner or the indirect manner as described above, in order to increase the joint strength, group III nitride film 13 and support substrate 11 are preferably bonded to each other in an indirect manner with joint film 12 interposed therebetween as shown in FIG. 4 (A). Details will be described below.

Referring to FIG. 4 (A), the step of bonding group III nitride film 13 and support substrate 11 to each other in an indirect manner with joint film 12 interposed therebetween includes: the sub step of forming joint film 12a on main surface 11m of support substrate 11 (FIG. 4 (A1)); the sub step of forming joint film 12b on main surface 13n of group III nitride film 13 (FIG. 4 (A2)); and the sub step of bonding joint film 12a formed on main surface 11m of support substrate 11 and joint film 12b formed on main surface 13n of group III nitride film 13 to each other (FIG. 4 (A3)). These sub steps are performed to join and thereby integrate joint film 12a and joint film 12b bonded to each other into joint film 12, and support substrate 11 and group III nitride film 13 are joined to each other with joint film 12 interposed therebetween.

As to the method for manufacturing group III nitride composite substrate 1 in the present embodiment as well, due to the presence of surface roughness of respective main surfaces of support substrate 11, group III nitride film 13, and joint films 12, 12a, 12b, main-surface through hole 13h of group III nitride film 13, non-uniformity of bonding, and the like, there are formed, in joint interface 100, joined region 100b where group III nitride film 13 and support substrate 11 are joined to each other in either the direct manner or the indirect manner, and non-joined region 100n where group III nitride film 13 and support substrate 11 are not joined to each other in either the direct manner or the indirect manner. The description of joined region 100b and non-joined region 100n is given above.

The method for forming joint films 12a, 12b is not particularly limited. In order to reduce the cost of forming the joint film, it is preferable to perform sputtering, vapor deposition, CVD (Chemical Vapor Deposition), or the like. The method for bonding support substrate 11 and group III nitride film 13 to each other by bonding joint film 12a and joint film 12b to each other is not particularly limited, and preferred methods are direct bonding method, surface activated bonding method, high-pressure bonding method, high vacuum bonding method, and the like as described above.

<Step of Reducing Thickness of at least One of Group III Nitride Film and Support Substrate>

Referring to FIG. 4 (B), the method for manufacturing group III nitride composite substrate 1 in the present embodiment includes the step of subsequently reducing the thickness of at least one of group III nitride film 13 and support substrate 11 bonded to each other. Here, the method for reducing the thickness of at least one of group III nitride film 13 and support substrate 11 is not particularly limited, and may for example be the method according to which the substrate whose thickness is to be reduced is cut in parallel with the main surface, the method according to which the main surface of the substrate whose thickness is to be reduced is ground and/or polished, the method according to which the main surface of the substrate whose thickness is to be reduced is etched, the method by means of a laser, or the like. The method by means of a laser is a method according to which a laser beam is applied so that the focus of the laser beam is located at a predetermined depth from the main surface of the substrate. In the case of the method by means of a laser, the chemical composition of the region of the position at a predetermined depth from the main surface of the substrate where the laser beam is focused is changed, and accordingly the substrate can be divided at this region. Since the method by means of a laser changes the chemical composition of a region of a position at a predetermined depth from the main surface of the substrate and does not change the chemical composition of the region other than the above-referenced region, femtosecond laser, picosecond laser, or the like is preferably used.

Third Embodiment

Method for Manufacturing Group III Nitride Semiconductor Device

Figure 5:
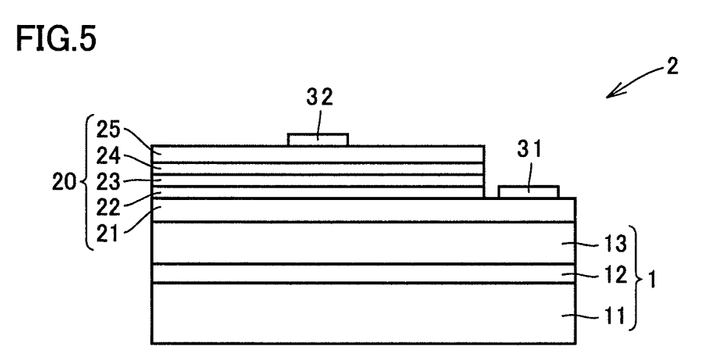
FIG. 5 is a schematic cross-sectional view showing an example of the group III nitride semiconductor device produced by the method for manufacturing a group III nitride semiconductor device according to the present invention.

Referring to FIG. 5, a method for manufacturing a group III nitride semiconductor device 2 which is still another embodiment of the present invention includes the steps of: preparing group III nitride composite substrate 1; and growing at least one group III nitride layer 20 on main surface 13m on the side of group III nitride film 13 of group III nitride composite substrate 1. The method for manufacturing group III nitride semiconductor device 2 in the present embodiment can include the above steps to thereby manufacture group III nitride semiconductor devices with a high yield.

<Step of Preparing Group III Nitride Composite Substrate>

The method for manufacturing group III nitride semiconductor device 2 in the present embodiment includes the step of firstly preparing group III nitride composite substrate 1. This step of preparing group III nitride composite substrate 1 is similar to the steps in the method for manufacturing group III nitride composite substrate 1 in the second embodiment.

<Step of Growing Group III Nitride Layer>

The method for manufacturing group III nitride semiconductor device 2 in the present embodiment includes the step of subsequently growing at least one group III nitride layer 20 on main surface 13m on the side of group III nitride film 13 of group III nitride composite substrate 1.

The method for growing group III nitride layer 20 is not particularly limited. In order to grow group III nitride layer 20 of a high crystal quality, preferred methods include vapor phase methods such as MOCVD (Metal Organic Chemical Vapor Deposition), MBE (Molecular Beam Epitaxy), HVPE (Hydride Vapor Phase Epitaxy), sublimation method, and the like, and liquid phase methods such as high nitrogen pressure solution method, flux method, and the like.

The structure of group III nitride layer 20 to be grown varies depending on the type and the function of the group III nitride semiconductor device. In the case where group III nitride semiconductor device 2 is a light-emitting device, group III nitride layer 20 may be formed on main surface 13m on the side of group III nitride film 13 of group III nitride composite substrate 1 by growing a first-conductivity-type GaN layer 21, a first-conductivity-type $Al_sGa_{1-s}N$ layer 22 (here, s meets 0<s<1), a light-emitting layer 23, a second-conductivity-type $Al_tGa_{1-t}N$ layer 24 (here, t meets 0<t<1), and a second-conductivity-type GaN layer 25, in this order.

The method for manufacturing group III nitride semiconductor device 2 in the present embodiment may include the step of subsequently forming electrodes (a first electrode and a second electrode). In group III nitride layer 20, second-conductivity-type GaN layer 25, second-conductivity-type $Al_tGa_{1-t}N$ layer 24, light-emitting layer 23, and first-conductivity-type $Al_sGa_{1-s}N$ layer 22 may each be partially removed by mesa etching to expose a part of first-conductivity-type GaN layer 21. On the exposed main surface of first-conductivity-type GaN layer 21, first electrode 31 may be formed. On the exposed main surface of the second-conductivity-type GaN layer, second electrode 32 may be formed. The method for forming first electrode 31 and second electrode 32 is not particularly limited, and may be CVD (Chemical Vapor Deposition), sputtering, vapor deposition, or the like.

EXAMPLES

Example 1

1. Fabrication of Group III Nitride Composite Substrate (1) Bonding Group III Nitride Film and Support Substrate Referring to FIG. 4 (A), group III nitride film 13 and support substrate 11 were bonded to each other in the following way.

Referring to FIG. 4 (A1), support substrate 11 was prepared. Specifically, three mullite ($Al_2O_3$—$SiO_2$) substrates each having two main surfaces both polished into a mirror surface (flat surface having an arithmetic mean surface roughness Ra defined under JIS B0601 of 1 nm or less, this definition will be applied hereinafter) and having a diameter of 10.0 cm and a thickness of 500 μm were prepared. On main surface 11m of this support substrate 11, an $SiO_2$ film of 1 μm in thickness was formed as joint film 12a by CVD.

Referring to FIG. 4 (A2), group III nitride film 13 was prepared. Specifically three different GaN films A to C each having two main surfaces both polished into a mirror surface and having a diameter of 10.0 cm and a thickness of 400 μm were prepared. GaN film A was not actively doped with a conductivity improver impurity. GaN film B was doped with O (oxygen) atoms which serve as a conductivity improver impurity at a concentration of $7\times10^{17}$ cm$^{-3}$. GaN film C was doped with O (oxygen) atom which serve as a conductivity improver impurity at a concentration of $1.6\times10^{18}$ cm$^{-3}$.

On main surface 13n which was a (000-1) plane corresponding to an N atomic plane of group III nitride film 13, an $SiO_2$ film of 1 μm in thickness was formed as joint film 12b by CVD.

Referring next to FIG. 4 (A3), each of main surface 12am of joint film 12a formed on support substrate 11 and main surface 12bn of joint film 12b formed on group III nitride film 13 was polished into a mirror surface, and thereafter main surface 12am of joint film 12a and main surface 12bn of joint film 12b were bonded to each other. Annealing was performed by raising the temperature to 700° C. in an $N_2$ gas (nitrogen gas) atmosphere to thereby increase the joint strength.

The three different bonded substrates in which they were thus bonded to each other were each cut by dicing into eight bonded substrate pieces having a main surface of 20 mm×20 mm (square of 20 mm×20 mm, which will also be applied hereinafter).

(2) Adjustment of Thickness of Group III Nitride Film

Referring to FIG. 4 (B), the thickness of group III nitride film 13 of the eight bonded substrate pieces obtained from each of the three different bonded substrates was adjusted by polishing the main surface so that respective group III nitride films were 5 μm, 8 μm, 10 μm, 20 μm, 50 μm, 100 μm, 200 μm, and 500 μm. Thus, eight group III nitride composite substrates were obtained.

2. Measurement of Sheet Resistance of Group III-Nitride-Film-Side Main Surface of Group III Nitride Composite Substrate For the 24 group III nitride composite substrates 1 obtained from the three different bonded substrates produced in the above-described manner (eight group III nitride composite substrates per each of the three different bonded substrates), the sheet resistance of group III-nitride-film 13-side main surface 13m was measured by the four-terminal method. The results are summarized in Table 1.

TABLE 1

| group III nitride film | | sheet resistance |
|---|---|---|
| type | thickness (μm) | (Ω/sq) |
| GaN film A | 5 | 403.6 |
| | 8 | 250.8 |
| | 10 | 196.1 |
| | 20 | 101.6 |
| | 50 | 41.5 |
| | 100 | 19.8 |
| | 200 | 9.7 |
| | 500 | 3.8 |
| GaN film B | 5 | 157.7 |
| | 8 | 101.3 |
| | 10 | 78.9 |
| | 20 | 39.2 |

TABLE 1-continued

| group III nitride film | | sheet resistance |
|---|---|---|
| type | thickness (μm) | (Ω/sq) |
| | 50 | 18.1 |
| | 100 | 7.4 |
| | 200 | 3.7 |
| | 500 | 1.3 |
| GaN film C | 5 | 40.7 |
| | 8 | 24.5 |
| | 10 | 19.4 |
| | 20 | 9.7 |
| | 50 | 3.6 |
| | 100 | 1.7 |
| | 200 | 0.9 |
| | 500 | 0.3 |

3. Fabrication of Group III Nitride Semiconductor Device

Referring to FIG. 5, on main surface 13m which was a (0001) plane corresponding to a group III atomic plane of group III nitride film 13 in group III nitride composite substrate 1, group III nitride layer 20 was grown by MOCVD. Specifically, an n-type GaN layer having a thickness of 5 μm which was first-conductivity-type GaN layer 21, an n-type $Al_{0.05}Ga_{0.95}N$ layer having a thickness of 0.5 μm which was first-conductivity-type $Al_sGa_{1-s}N$ layer 22 (here, s meets 0<s<1), an MQW (Multiple Quantum Well) structure layer having a thickness of 100 nm and made up of six cycles of $In_{0.15}Ga_{0.85}N$ layer and $In_{0.01}Ga_{0.99}N$ layer which was light-emitting layer 23, a p-type $Al_{0.20}Ga_{0.80}N$ layer having a thickness of 20 nm which was second-conductivity-type $Al_tGa_{1-t}N$ layer 24 (here, t meets 0<t<1), and a p-type GaN layer having a thickness of 0.15 μm which was second-conductivity-type GaN layer 25 were grown in this order.

Next, second-conductivity-type GaN layer 25, second-conductivity-type $Al_tGa_{1-t}N$ layer 24, light-emitting layer 23, and first-conductivity-type $Al_sGa_{1-s}N$ layer 22 were each partially removed by mesa etching to expose a part of first-conductivity-type GaN layer 21.

Next, on the exposed main surface of first-conductivity-type GaN layer 21, an n-side electrode was formed as first electrode 31 by electron beam vapor deposition. In addition, on the exposed main surface of second-conductivity-type GaN layer 25, a p-side electrode was formed as second electrode 32 by electron beam vapor deposition. In this way, 24 group III nitride semiconductor devices were fabricated.

A reference group III nitride semiconductor device was prepared in the following way. On main surface 13m of the GaN substrate that was a (0001) plane corresponding to a Ga atomic plane, group III nitride layer 20 of the same structure as the above-described one was formed in a similar manner to the above-described one. The GaN substrate had the two main surfaces both polished into a mirror surface and having a size of 20 mm×20 mm and a thickness of 500 μm, and was doped with a conductivity improver impurity, namely O (oxygen) atoms, at a concentration of $1.6 \times 10^{18}$ $cm^{-3}$.

4. Measurement of Emission Intensity of Group III Nitride Semiconductor Device The emission intensity of the 24 group III nitride semiconductor devices and the reference group III nitride semiconductor device obtained as described above was measured in the following way. Current of 80 mA was applied to the group III nitride semiconductor device. The emission intensity at a peak wavelength of 450 nm of the emission spectrum at this time was measured by the EL (Electro Luminescence) method. The ratio of the emission intensity of each of the 24 group III nitride semiconductor devices, relative to the emission intensity of the reference group III nitride semiconductor device, was calculated for use as a relative emission intensity. A light-emitting device having a group III nitride composite substrate including GaN film A of 5 μm in thickness and having a sheet resistance of 403.6 Ω/sq, and a light-emitting device having a group III nitride composite substrate including GaN film A of 8 μm in thickness and having a sheet resistance of 250.8 Ω/sq each had a low relative emission intensity of 0.01 or less. The relative emission intensity of light-emitting devices having the other group III nitride composite substrates had a higher relative emission intensity of 0.1 or more.

Example 2

As group III nitride films 13, 20 GaN films having a diameter of two inches (5.08 cm) and a thickness of 500 μm, doped with O (oxygen) atoms which were a conductivity improver impurity at a concentration of $7 \times 10^{17}$ $cm^{-3}$, and having two main surfaces both polished into a mirror surface were prepared.

Of these GaN films, ten GaN films were polished so that the thickness was reduced to 200 μm. As a result, breakage and/or cracks occurred to seven GaN films out of the ten GaN films.

To the remaining ten GaN films each, a mullite substrate having a diameter of two inches (5.08 cm) and a thickness of 400 μm was bonded through a similar procedure to Example 1, and thereafter the bonded GaN film was polished so that the thickness was reduced to 200 μm. Then, no breakage and/or cracks occurred to all of the ten GaN films.

Example 3

Six group III nitride composite substrates 1 were fabricated through a similar procedure to Example 1, except that a GaN film having a diameter of two inches (5.08 cm) and a thickness of 500 μm, doped with no conductivity improver impurity, and having two main surfaces both polished into a mirror surface was used as group III nitride film 13, and that a watermark was formed on the surface to be bonded to thereby change the area of the bonded region. Here, the watermark is a dry stain formed as follows. As moisture in a portion of a surface where an impurity is present due to cleaning contamination or the like is dried, the portion is dried with the impurity aggregated, and accordingly the dry stain is formed. The watermark can be formed by wetting a surface where the watermark is to be formed, with low-purity water rather than ultrapure water and drying it to thereby form the watermark in the portion wet with the low-impurity water.

For the obtained six group III nitride composite substrates 1, the area of joined region 100b was measured with a surface detect inspection apparatus using a laser. As a result, respective areas of the joined regions of the substrates relative to the area of main surface 1m were 34%, 57%, 64%, 70%, 87%, and 95%. Of these group III nitride composite substrates, group III nitride composite substrates 1 in which the area of joined region 100b was 70% or more relative to the area of main surface 1m had non-joined partial regions constituting non-joined region 100n that all had a maximum size in radial direction of less than 20 mm. As for group III nitride composite substrates 1 in which the area of joined region 100b was 64% or less relative to the area of main surface 1m, some non-joined partial regions constituting non-joined region 100n had a maximum size in radial direction of 20 mm or more. Moreover, group III nitride composite substrates 1 in which the area of joined region 100b was 64% or less relative to the area of main surface 1m were heated to 700° C. As a result, group III nitride film 13 was peeled off during the heating, from support substrate 11 from the non-joined partial region with a maximum size in radial direction of 20 mm or more.

Example 4

Three group III nitride composite substrates 1 were fabricated through a similar procedure to Example 1, except that: a GaN film having a diameter of two inches (5.08 cm) and a thickness of 500 µm, doped with no conductivity improver impurity, and having two main surfaces both polished into a mirror surface was used as group III nitride film 13; a polycrystalline Mo substrate having a diameter of two inches (5.08 cm) and a thickness of 500 µm and having two main surfaces both polished into a mirror surface was used as support substrate 11; the surfaces to be bonded to each other were cleaned in the process of bonding to thereby reduce generation of non-joined regions; and a water mark having a diameter on the order of 15 mm was formed on the surface to be bonded to thereby form a non-joined region at a predetermined position of the group III nitride composite substrate.

For the obtained three group III nitride composite substrates 1, the position of the non-joined region was measured with an ultrasonic microscope. As a result, in one group III nitride composite substrate, there was formed the non-joined region including a non-joined partial region having a maximum size in radial direction on the order of 10 mm and abutting on the perimeter of the main surface. In another group III nitride composite substrate, there was formed the non-joined region including only a non-joined partial region having a maximum size in radial direction on the order of 10 mm and failing to abut on the perimeter of the main surface. In the remaining one group III nitride composite substrate, the area of the non-joined region was 83% relative to the area of the main surface.

The obtained three group III nitride composite substrates were heated to 700° C. As a result, the group III nitride composite substrate in which there was formed the non-joined region including the non-joined partial region which had a maximum size in radial direction on the order of 10 mm and abutted on the perimeter of the main surface was broken during the heating. The remaining group III nitride composite substrates were not broken.

Example 5

As group III nitride films, eight GaN films whose two main surfaces were both polished into a mirror surface, main surface was 20 mm×20 mm, and thickness was 300 µm were prepared. The eight GaN films were divided into four sets each including two GaN films, and main-surface through holes having a diameter on the order of 50 µm were formed so that the area of the main-surface through holes relative to the area of the main surface were 5%, 10%, 20%, and 30%, respectively in these four sets.

Moreover, eight substrates were prepared in which the support substrate was a sapphire substrate whose main surface was 20 mm×20 mm and thickness was 400 µm and an $SiO_2$ film was formed as the joint film on the main surface of the sapphire substrate. The main surface of the joint film was polished into a mirror surface. After this, four of the eight substrates were cleaned multiple times in an aqueous solution containing 37% by mass of HCl (hydrochloric acid) and 30% by mass of $H_2O_2$ (hydrogen peroxide), to thereby remove an impurity containing metal on the surface to be bonded. The remaining four substrates were cleaned with IPA (isopropyl alcohol).

The four group III nitride films in which respective areas of the main-surface through holes were 5%, 10%, 20%, and 30% relative to the area of the main surface, and the four support substrates in which the surface of the joint film to be bonded was cleaned with HCl and $H_2O_2$ were bonded to each other under similar conditions to Example 1. Further, the four group III nitride films in which respective areas of the main-surface through holes were 5%, 10%, 20%, and 30% relative to the area of the main surface and the four support substrates in which the surface of the joint film to be bonded was cleaned with IPA were bonded to each other under similar conditions to Example 1.

After they were thus bonded to each other, a tensile test was performed in the following way. The tensile test was performed by attaching a jig of 10 mm×10 mm with an epoxy adhesive to the front and rear sides of the group III nitride composite substrate and pulling both ends of the jig. The results are summarized in Table 2. In Table 2, the composite substrates on which fracture occurred between the epoxy adhesive and the jig exhibit a higher joint strength than those in which the group III nitride film and the joint film are separated from each other along their interface.

TABLE 2

| method for cleaning surface to be bonded | area (%) of main-surface through hole in group III nitride film relative to area of main surface | region of fracture and form of fracture under tensile test |
| --- | --- | --- |
| cleaning with HCl and $H_2O_2$ | 5 | fracture along interface between epoxy adhesive and jig |
| | 10 | separation along interface between group III nitride film and joint film |
| | 20 | separation along interface between group III nitride film and joint film |
| | 30 | separation along interface between group III nitride film and joint film |
| cleaning with IPA | 5 | fracture along interface between epoxy adhesive and jig |
| | 10 | fracture along interface between epoxy adhesive and jig |
| | 20 | separation along interface between group III nitride film and joint film |
| | 30 | separation along interface between group III nitride film and joint film |

Referring to Table 2, the composite substrates which were cleaned with IPA had a higher joint strength where the area of the main-surface through hole of the group III nitride film was 10% or less relative to the area of the main surface. In addition, the concentration of an impurity containing metal on the surface to be bonded of the joint film cleaned with HCl and $H_2O_2$ and that of the joint film cleaned with IPA were measured by TXRF (total reflection x-ray fluorescence) analysis. Those cleaned with HCl and $H_2O_2$ had an Fe concentration and an Ni concentration which were both $1\times10^{10}$ $cm^{-2}$ or less. Those cleaned with IPA had an Fe concentration of $5.7\times10^{-11}$ $cm^{-2}$ and an Ni concentration of $1.5\times10^{11}$ $cm^{-2}$.

Comparative Example 1

As the group III nitride film, one GaN film having a diameter of two inches (5.08 cm) and a thickness of 400 µm, doped with O (oxygen) atoms at a concentration of $6\times10^{17}$ cm$^{-3}$ which was a conductivity improver impurity, and having two main surfaces both polished into a mirror surface was prepared. In a main surface, which was an N atomic surface of the group III nitride film, H (hydrogen) ions were implanted to a position at a depth of about 0.7 μm from the main surface. The H ions were implanted with an acceleration voltage of 100 keV and a dose of $5\times10^{17}$ cm$^{-2}$. The main surface, where the H ions were implanted, of the group III nitride film implanted with the H ions, and a mullite substrate having a diameter of two inches (5.08 cm) and a thickness of 500 μm, were bonded to each other and annealed through a similar procedure to Example 1. Accordingly, the group III nitride film was separated along the region where the H ions were implanted, so that a group III nitride composite substrate in which a group III nitride film of 0.3 μm in thickness is formed on the mullite substrate was obtained. The sheet resistance of the obtained group III nitride composite substrate was $1\times10^{10}$ Ω/sq or more.

Comparative Example 2

A group III nitride composite substrate having a group III nitride film of 0.3 μm in thickness on an Mo substrate was produced through a similar procedure to Comparative Example 1, except that the Mo substrate having a diameter of two inches (5.08 cm) and a thickness of 300 μm and having two main surfaces both polished into a mirror surface was used as the support substrate, and that the dose of H ions was $3.5\times10^{17}$ cm$^{-2}$. The obtained group III nitride composite substrate was further heat-treated at 800° C. for three hours in an N$_2$ gas (nitrogen gas) atmosphere. Accordingly, the sheet resistance was reduced to 6700 Ω/sq in most of the region, while the sheet resistance was still a high resistance of 35000 Ω/sq in a part of the region.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A group III nitride composite substrate comprising a group III nitride film and a support substrate formed from a material different in chemical composition from said group III nitride film, said group III nitride film being joined to said support substrate in one of a direct manner and an indirect manner, said group III nitride film having a thickness of 10 μm or more, and a sheet resistance of a group III-nitride-film-side main surface of said group III nitride composite substrate being 200 Ω/sq or less, said group III-nitride-film-side main surface being a main surface common to said group III nitride composite substrate and said group III nitride film, wherein an area of a joined region joining said group III nitride film and said support substrate is 70% or more relative to an area of the main surface, and a non-joined region failing to join said group III nitride film and said support substrate includes at least one non-joined partial region, and said non-joined partial region is a small non-joined partial region having a maximum size in radial direction of less than 20 mm.

2. The group III nitride composite substrate according to claim 1, wherein a non-joined region failing to join said group III nitride film and said support substrate includes at least one non-joined partial region, and said non-joined partial region is an inner non-joined partial region failing to abut on a perimeter of the main surface.

3. The group III nitride composite substrate according to claim 1, wherein said group III nitride film has a main-surface through hole, and an area of said main-surface through hole is 10% or less relative to an area of the main surface.

4. The group III nitride composite substrate according to claim 1, wherein a joint interface between said group III nitride film and said support substrate includes an impurity containing metal, and the concentration of said impurity is $1\times10^{10}$ cm$^{-2}$ or more.

5. The group III nitride composite substrate according to claim 1, wherein said group III nitride film has a thermal expansion coefficient of more than 0.7 times and less than 1.4 times as large as a thermal expansion coefficient of said support substrate.

6. The group III nitride composite substrate according to claim 1, wherein said support substrate has a fracture toughness of 1 MNm$^{-2/3}$ or more, and said support substrate has a thickness of 50 μm or more.

7. The group III nitride composite substrate according to claim 1, wherein said indirect manner is a manner of interposing a joint film between said group III nitride film and said support substrate.

* * * * *